(12) United States Patent
Chang et al.

(10) Patent No.: US 8,992,792 B2
(45) Date of Patent: Mar. 31, 2015

(54) METHOD OF FABRICATING AN ULTRA LOW-K DIELECTRIC SELF-ALIGNED VIA

(71) Applicant: Applied Materials, Inc., Santa Clara, CA (US)

(72) Inventors: Chih-Yang Chang, San Jose, CA (US); Sean S. Kang, San Ramon, CA (US); Chia-Ling Kao, San Jose, CA (US); Nikolaos Bekiaris, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 115 days.

(21) Appl. No.: 13/724,698

(22) Filed: Dec. 21, 2012

(65) Prior Publication Data

US 2014/0024220 A1     Jan. 23, 2014

Related U.S. Application Data

(60) Provisional application No. 61/673,919, filed on Jul. 20, 2012.

(51) Int. Cl.
| | |
|---|---|
| C03C 15/00 | (2006.01) |
| H01L 21/3065 | (2006.01) |
| H01L 21/3105 | (2006.01) |
| H01L 21/311 | (2006.01) |
| H01L 21/768 | (2006.01) |

(52) U.S. Cl.
CPC ........ *H01L 21/3065* (2013.01); *H01L 21/3105* (2013.01); *H01L 21/31116* (2013.01); *H01L 21/31138* (2013.01); *H01L 21/31144* (2013.01); *H01L 21/76811* (2013.01); *H01L 21/76813* (2013.01); *H01L 21/76814* (2013.01)
USPC ............. 216/61; 216/71; 216/72; 216/75; 438/717; 438/736

(58) Field of Classification Search
CPC ........... H01L 21/3065; H01L 21/3081; H01L 21/31138; H01L 21/02172; H01L 21/31116
USPC ............. 216/67, 71, 72, 75; 438/717, 736
See application file for complete search history.

(56) References Cited

U.S. PATENT DOCUMENTS

| | | | |
|---|---|---|---|
| 2008/0102638 A1* | 5/2008 | Naik et al. | 438/702 |
| 2011/0207329 A1* | 8/2011 | Shih et al. | 438/702 |

\* cited by examiner

*Primary Examiner* — Binh X Tran
(74) *Attorney, Agent, or Firm* — Blakely Sokoloff Taylor Zafman LLP

(57) ABSTRACT

Methods of fabricating ultra low-k dielectric self-aligned vias are described. In an example, a method of forming a self-aligned via (SAV) in a low-k dielectric film includes forming a trench pattern in a metal nitride hardmask layer formed above a low-k dielectric film formed above a substrate. A via pattern is formed in a masking layer formed above the metal nitride hardmask layer. The via pattern is etched at least partially into the low-k dielectric film, the etching comprising using a plasma etch using a chemistry based on $CF_4$, $H_2$, and a diluent inert gas composition.

8 Claims, 8 Drawing Sheets

OXIDIZING ASH

~40% in SiCOH with k= 2.5

~10% in SiCOH with k= 2.5

REDUCING ASH

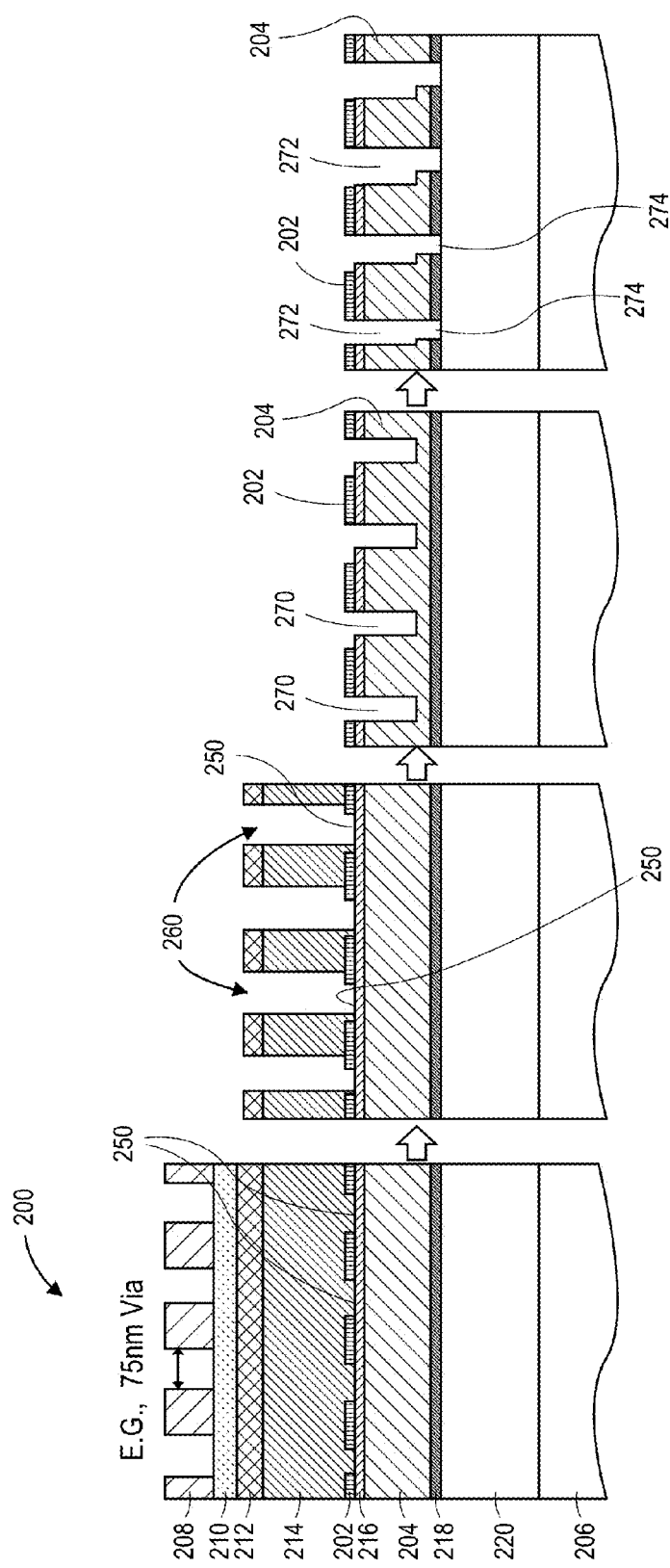

METHOD OF FABRICATING AN ULTRA LOW-K DIELECTRIC SELF-ALIGNED VIA

CROSS REFERENCE TO RELATED APPLICATIONS

This application claims the benefit of U.S. Provisional Application No. 61/673,919, filed Jul. 20, 2012, the entire contents of which are hereby incorporated by reference herein.

BACKGROUND

1) Field

Embodiments of the present invention pertain to the field of semiconductor processing and, in particular, to methods of fabricating ultra low-k dielectric self-aligned vias.

2) Description of Related Art

In semiconductor manufacturing, a low-k dielectric is a material with a small dielectric constant relative to silicon dioxide. Low-k dielectric material implementation is one of several strategies used to allow continued scaling of microelectronic devices. In digital circuits, insulating dielectrics separate the conducting parts (e.g., wire interconnects and transistors) from one another. As components have scaled and transistors have moved closer together, the insulating dielectrics have thinned to the point where charge build-up and crosstalk adversely affect the performance of the device. Replacing the silicon dioxide with a low-k dielectric of the same thickness reduces parasitic capacitance, enabling faster switching speeds and lower heat dissipation.

However, significant improvements are needed in the evolution of low-k dielectric processing technology.

BRIEF DESCRIPTION OF THE DRAWINGS

FIGS. 2A-2D illustrate cross-sectional views of various operations in a method of fabricating ultra low-k dielectric self-aligned vias, in accordance with an embodiment of the present invention.

DETAILED DESCRIPTION

Figure 1:
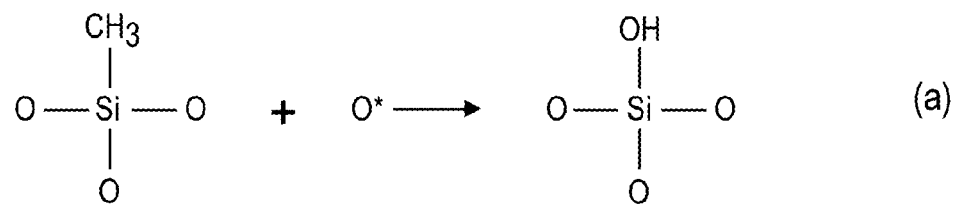
FIG. 1 illustrates mechanisms through which a low-k dielectric layer may be damages or impacted under conventional oxidizing plasma conditions used to remove polymer formed in a conventions fluorocarbon-based etching process.
Figure 1:
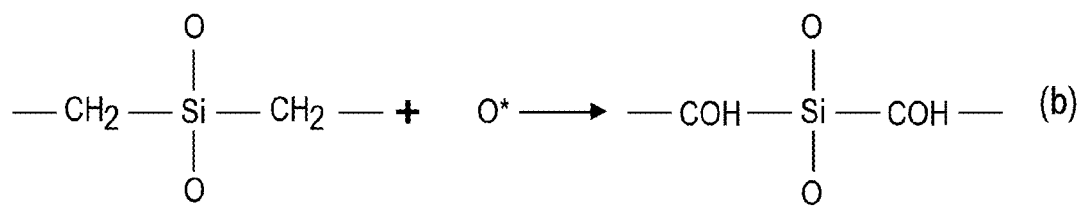
Figure 1:
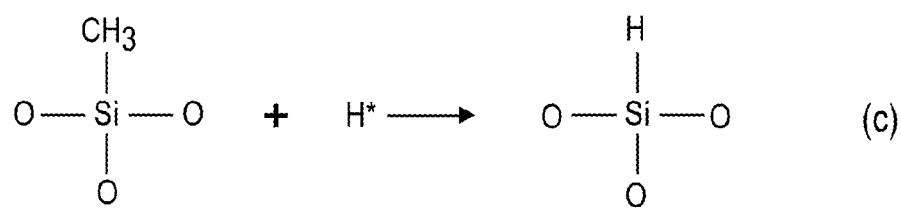
Figure 2E:
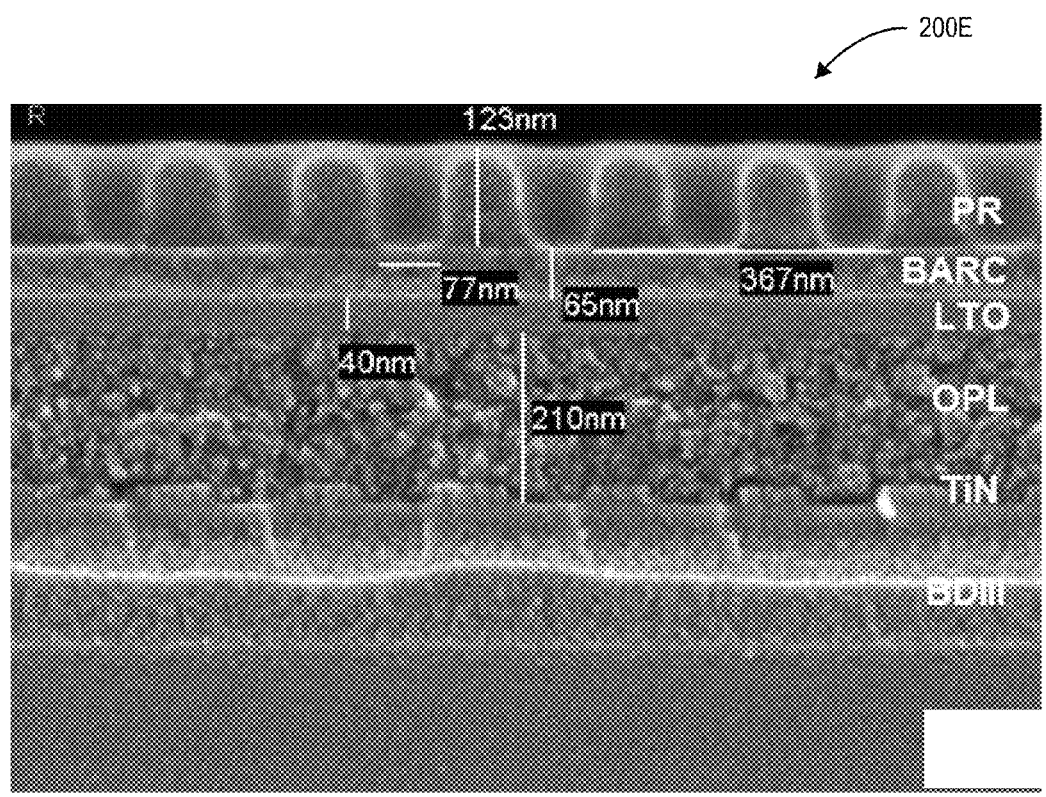
FIG. 2E is a scanning electron microscope (SEM) image of an incoming material stack similar to that of material stack described in association with FIG. 2A, in accordance with an embodiment of the present invention.

Methods of fabricating ultra low-k dielectric self-aligned vias are described. In the following description, numerous specific details are set forth, such as specific plasma treatments and effects for modifying portions of low-k dielectric films, in order to provide a thorough understanding of embodiments of the present invention. It will be apparent to one skilled in the art that embodiments of the present invention may be practiced without these specific details. In other instances, well-known aspects, such as photolithography patterning and development techniques for mask formation, are not described in detail in order to not unnecessarily obscure embodiments of the present invention. Furthermore, it is to be understood that the various embodiments shown in the Figures are illustrative representations and are not necessarily drawn to scale.

As process dimensions continuous to shrink, a litho-etch, litho-etch (LELE) double exposure patterning for semiconductor device is typically required to print 64 nanometer (nm) pitch metal layers (Mx levels) or below. However, poor overlay can be a significant factor for consideration in successful double patterning applications. For example, without self-aligned via (SAV) processes, the dielectric space between copper lines and vias can become small which can cause reliability issues.

To address the above noted issues, one or more embodiments described herein is directed to a SAV plasma etch process. In one such embodiment, etch processes described herein can be used for sub 20 nm-node pitch lines and vias in silicon based devices. In one example, a SAV process is employed to build trench-first dual-damascene (DD) dielectric interconnects with a titanium nitride (TiN) mask. The TiN etch selectivity to a low k dielectric film dielectric (such as to Black Diamond III; k=2.55) can be exploited to achieve self-aligned fashion.

More specifically, in a conventional SAV process, $CF_4$, $CHF_3$, $C_xH_yF_z/N_2$ process gases are used. The conventional gas chemistries do not provide sufficiently high selectivity to TiN and, thus, require much thicker TiN hardmask (HM) layers than what is desired. However, the thicker TiN hard mask may not be desirable for subsequent copper (Cu) metal fill in the trench and via. Instead, one or more embodiments are directed to increasing selectivity to TiN, which can enable minimizing the thickness of TiN used. In a specific embodiment, the addition of additional hydrogen ($H_2$) gas in a mixture of carbon tetrafluoride/nitrogen ($CF_4/N_2$) gases can mitigate chemical reaction with a TiN hard mask and improve (reduce) TiN encroachment by increasing the selectivity to TiN. In an embodiment, a series of special tuning nodes is used, including hydrogen flow rate, argon flow rate, chamber pressure, temperature of electrostatic chuck (ESC) and RF bias power, etc. A series of experiments described below demonstrate how to systematically optimize the SAV etch conditions. In one embodiment, one or more SAV etch processes described herein is based on a new gas chemistry combining $CF_4/H_2$ to provide excellent profile and TiN selectivity.

In addition, new approaches and processing sequences for etching low k films damage-free to the low k are described. Traditional dielectric etching is can result in sidewall damage caused by plasma processing and during post etch polymer residue removal. FIG. 1 illustrates mechanisms through which a low-k dielectric layer may be damages or impacted under conventional oxidizing plasma conditions used to remove polymer formed in a conventions fluorocarbon-based etching process. Referring to mechanism (a) of FIG. 1, when undergoing an oxidizing ash, an $SiO_3$-methyl fragment, which makes up approximately 40% of a SiCOH low-k film with a dielectric constant of about 2.5, can undesirably lose its methyl group to a hydroxide group. Referring to mechanism (b) of FIG. 1, when undergoing an oxidizing ash, an $SiO_2$—$(CH_2)_2$ fragment, which makes up approximately 10% of a SiCOH low-k film with a dielectric constant of about 2.5, can undesirably be converted to an $SiO_2$—$(COH)_2$ fragment. Referring to mechanism (c) of FIG. 1, when undergoing a reducing ash, an $SiO_3$-methyl fragment, which makes up approximately 40% of a SiCOH low-k film with a dielectric constant of about 2.5, can undesirably lose its methyl group to a hydride ligand (H).

More generally, new plasma etch development and processes are described for ultra low-K self-aligned via fabrication. In an embodiment, a TiN hard mask is included in the etch process, and high selectivity to the TiN is achieved. In an embodiment, etch processes are performed in a C3 etch chamber. The embodiments described can be used more so as process dimensions continue to shrink, e.g., where additional improvements are required to enable the fabrication of high performance logic devices. As mentioned briefly above, a litho-etch, litho-etch (LELE) double patterning is commonly used to print sub 20 nm-node pitch lines and vias but overlay control is a challenge. A self-aligned via (SAV) process is crucial for LELE-manufactured device performance since, without such an approach, the dielectric space between Cu lines and vias becomes small which can cause reliability issues (e.g., dielectric breakdown and poor TDDB) or even shorts. As illustrated in greater detail below, a trench-first dual-damascene (DD) plasma etch SAV process approach is used to address these issues. In an example involving critical dimensions (CDs) 45 nanometers or less, a TiN hard mask (HM) is used in a material stack and is patterned in a C3 dielectric etcher. Embodiments may be especially useful for back end of line (BEOL) ultra low-k (Ulk) dual damascene (DD) applications. In one embodiment, a SAV process described herein is exhibits excellent profile regardless of the degree of via misalignment in the SAV direction and is free from TiOx by product residues.

In an example, FIGS. 2A-2D illustrate cross-sectional views of various operations in a method of fabricating ultra low-k dielectric self-aligned vias, in accordance with an embodiment of the present invention.

Referring to FIG. 2A an exemplary material stack 200 suitable for dry etch development and/or processing of ultra low-k self-aligned vias in a trench first dual damascene interconnect with TiN hard mask process flow is provided. Specifically, the material film 200 includes an approximately 15 nanometer titanium nitride (TiN) hardmask (HM) 202 and an approximately 180 nanometer ultra-low k material layer 204 (e.g., Black Diamond (BD) III: k=2.55) on 300-mm-diameter silicon wafers 206. Other layers include a patterned photoresist layer 208 (e.g., approximately 140 nanometers), e.g., having approximately 75 nanometers via dimensions patterned therein. Intervening layers such as a bottom anti-reflective coating (BARC) layer 210 (e.g., approximately 77 nanometer), a low temperature oxide layer 212 (e.g., approximately 50 nanometers), and an organic planarization layer (OPL) 214 (e.g., 250 nanometers) can be included between the patterned photoresist layer 208 and the titanium nitride (TiN) hardmask (HM) 202, as depicted in FIG. 2A. Furthermore, an intervening oxide layer 216 (e.g., approximately 20 nanometers) can be included between the titanium nitride (TiN) hardmask (HM) 202 and the ultra-low k material layer 204, while an etch stop layer 218 can be included below the ultra-low k material layer 204, as is also depicted in FIG. 2A. It is to be understood that the specific film stack shown is one of many suitable arrangements for SAV etch processing described herein, and is provided for illustration purposes. It is also to be understood that a complete film stack could also include underlying front of line (FEOL) device layers, such as transistor layers, as well as underlying BEOL metal layers. Furthermore, in the case that a sample is merely a test vehicle for etch process development, basic intervening layers such as an undoped silica glass (USG, e.g., 300 nanometers) layer 220 can be included for simplicity above the underlying substrate 206.

Although a host of material layers is mentioned above and shown in FIG. 2A, some key layers that will typically be involved in a process involving a self-aligned via process flow in the presence of a low-K material can include a metal hard mask layer 202, a photoresist layer 208, and a low-k dielectric layer 204. In one such embodiment, the metal hard mask layer 202 is a metal-containing layer such as, but not limited to, a layer of titanium nitride or a layer of tantalum nitride. The metal hard mask layer 202 is patterned with a plurality of openings 250, as shown in FIG. 2A.

The photoresist layer 208 can be composed of a material suitable for use in a lithographic process. That is, in an embodiment, the photoresist layer is exposed to a light source and subsequently developed. In one embodiment, the portions of the photoresist layer to be exposed to the light source will be removed upon developing the photoresist layer, e.g., the photoresist layer is composed of a positive photoresist material. In a specific embodiment, the photoresist layer is composed of a positive photoresist material such as, but not limited to, a 248 nanometer node resist, a 193 nanometer node resist, a 157 nanometer node resist, an extreme ultra-violet (EUV) resist, or a phenolic resin matrix with a diazonaphthoquinone sensitizer. In another embodiment, the portions of the photoresist layer to be exposed to the light source will be retained upon developing the photoresist layer, e.g., the photoresist layer is composed of a negative photoresist material. In a specific embodiment, the photoresist layer is composed of a negative photoresist material such as, but not limited to, poly-cis-isoprene and poly-vinyl-cinnamate.

In an embodiment, the low-k dielectric layer 204 has a permittivity less than that of silicon dioxide, e.g., less than approximately 3.9. In one embodiment, the low-k dielectric layer 204 is a material such as, but not limited to, a fluorine-doped silicon dioxide, a carbon-doped silicon dioxide, a porous silicon dioxide, a porous carbon-doped silicon dioxide, a porous SiLK, a spin-on silicone based polymeric dielectric, or a spin-on organic polymeric dielectric. In accordance with an embodiment of the present invention, as provided above, the low-k dielectric layer 204 is a Black Diamond (BD) III film having a k value of approximately 2.55. In another embodiment, the low-k dielectric layer 204 is a porous SiCOH layer having a dielectric constant of less than 2.7.

The underlying substrate 206 may be composed of a material suitable to withstand a fabrication process and upon which semiconductor processing layers may suitably reside. In accordance with an embodiment of the present invention, substrate 206 is composed of a group IV-based material such as, but not limited to, crystalline silicon, germanium or silicon/germanium. In a specific embodiment, providing substrate 206 includes providing a monocrystalline silicon substrate. In a particular embodiment, the monocrystalline silicon substrate is doped with impurity atoms. In another embodiment, substrate 206 is composed of a material. In an embodiment, a plurality of semiconductor devices resides on substrate 206, below low-k dielectric layer 204.

Referring to FIG. 2B, an offset pattern 260 is formed into, inter alia, the low-k dielectric layer 204. The offset pattern refers to misalignment with the openings 250 in the metal hard mask layer 202. The offset pattern 260 depicted can represent an offset tolerance with the fabrication of commercial wafers. Or, in another case, the offset may be intentionally formed for the sake of optimizing a SAV etch with TiN hard mask selectivity. For example, in a specific embodiment, a greater than 30 nm offset was generated by misaligning a first via (V1) lithography prior to plasma etch, as shown in FIG. 2B.

Referring to FIG. 2C, the offset pattern 260 of FIG. 2B is etched at least partially into the low-k dielectric layer 204 to form upper trenches 270. Additionally, any layers over the TiN hardmask layer 202 are removed, e.g., by an etch or ash process.

Referring to FIG. 2D, the pattern of the TiN hardmask layer 202 is etched at least partially into the low-k dielectric layer 204 to form modified (e.g., larger) upper trenches 272. Additionally, the etch extends the offset pattern 260 to the bottom of the low-k dielectric layer 204 and, possibly, through etch stop layer 218, to form lower trenches 274. The lower trenches 274 are effectively via trenches 274 which are self-aligned with the metal line upper trenches 272. Thus, upon metal fill of the trenches 272 and 274, a plurality of self-aligned vias can be formed. More specifically, the process shown in FIG. 2C may be referred to as a self-aligned via (SAV) and subsequent ash portion of the process flow, while the process shown in FIG. 2D may be referred to as a trench main etch (TME) portion of the process flow.

The above processing can, in an embodiment, be performed in a plasma etch chamber. For example, in one embodiment, one or more of the above processes is performed in an Applied Centura® Enabler dielectric etch system, available from Applied Materials of Sunnyvale, Calif., USA. In another embodiment, one or more of the above processes is performed in an Applied Materials™ AdvantEdge G3 etcher or in an Applied Materials™ C3 dielectric chamber, also available from Applied Materials of Sunnyvale, Calif., USA. In a specific embodiment, all the processes of FIGS. 2A-2D are performed in a single pass of an etch chamber.

In a particular embodiment, FIGS. 2A-2D illustrate a general dual damascene (DD) process sequence prior to metallization. After photoresist and OPL layer open, the clear offset pattern was shown in FIG. 2B. A series of experiments were performed to change the four important controllable parameters of the process conditions: hydrogen ($H_2$) flow rate, argon (Ar) flow rate, RF power, chamber pressure, and E-chuck temperature. These were manipulated by changing one parameter while keep the other parameters constant. The $H_2$ flow rate was varied from 0 to 300 SCCM and the Ar flow rate was varied from 0 to 1200 SCCM. The E-check temperature was changed from 60° C. to 20° C. The size, structure and profile of the vias were examined using Hitachi 4800 scanning electron microscopy (SEM). By way of demonstration, a series of scanning electron microscope (SEM) images is used to depict the process flow, or development thereof, shown in FIGS. 2A-2D. For example, FIG. 2E is a scanning electron microscope (SEM) image 200E of an incoming material stack similar to that of material stack 200 described in association with FIG. 2A, in accordance with an embodiment of the present invention.

Figure 3:
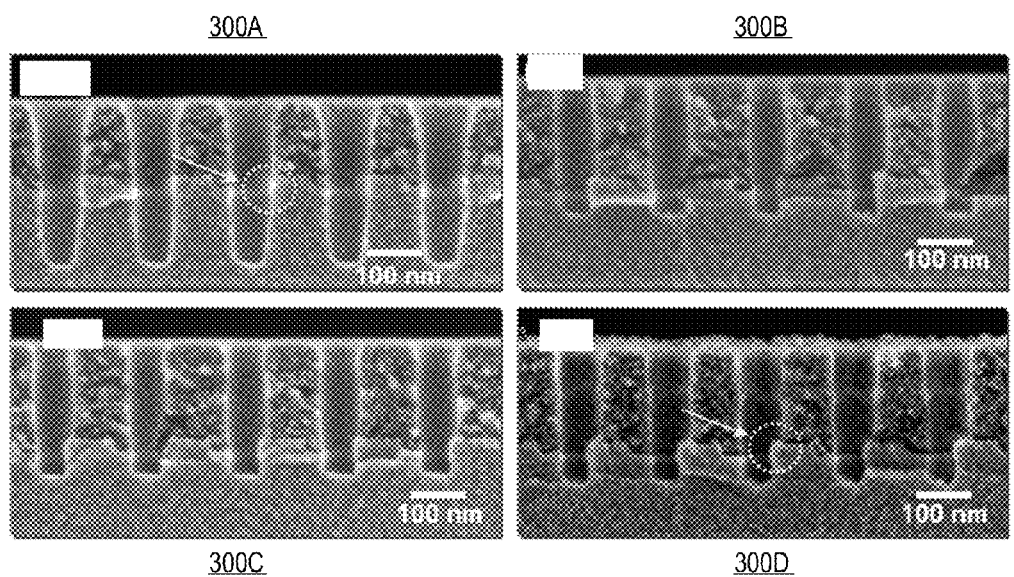
FIG. 3 is a series of SEM images 300A, 300B, 300C and 300D showing vias at different hydrogen gas flow rates, in accordance with an embodiment of the present invention.

FIG. 3 is a series of SEM images 300A, 300B, 300C and 300D showing vias at different hydrogen gas flow rates, in accordance with an embodiment of the present invention. Specifically, SEM image 300A is a control sample, to which a non-SAV process was performed. The arrow in 300A reveals TiN erosion completely. However, referring to images 300B-300D, increasing hydrogen gas inclusion in an SAV etch of a low-k dielectric film is represented. As can be seen, TiN selectivity increases with increasing $H_2$ flow rate. More specifically, for 300A the reference sample uses 0 SCCM of $H_2$; for 300B selectivity is improved at 150 SCCM $H_2$; for 300C, selectivity is significantly improved at 200 SCCM $H_2$; and for 300D the best selectivity is observed at 300 SCCM $H_2$.

Figure 4:
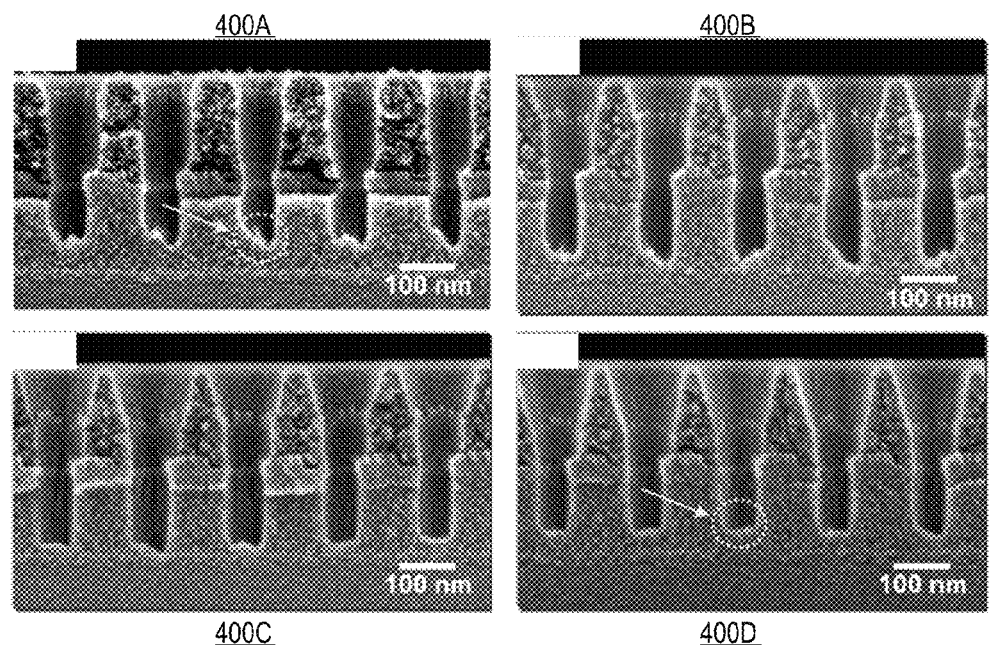
FIG. 4 is a series of SEM images 400A, 400B, 400C and 400D showing vias at different argon gas flow rates, but at the same hydrogen flow rates, in accordance with an embodiment of the present invention.

However, upon etching into the material stack with higher hydrogen gas flow, etch front problems can be observed. These can be mitigated by the inclusion of Ar gas. For example, FIG. 4 is a series of SEM images 400A, 400B, 400C and 400D showing vias at different argon gas flow rates, but at the same hydrogen flow rates, in accordance with an embodiment of the present invention. Referring to 400A, 0 SCCM Ar is used, and the worst etch front was observed. Referring to images 400B-400D, increasing argon gas inclusion in an SAV etch of a low-k dielectric film is represented. More specifically, for 400B etch front issues begin to be mitigated at 300 SCCM Ar; for 400C, etch front issues are significantly mitigated at 600 SCCM Ar; and for 400D least etch front issues are observed at 1200 SCCM Ar.

Figure 5:
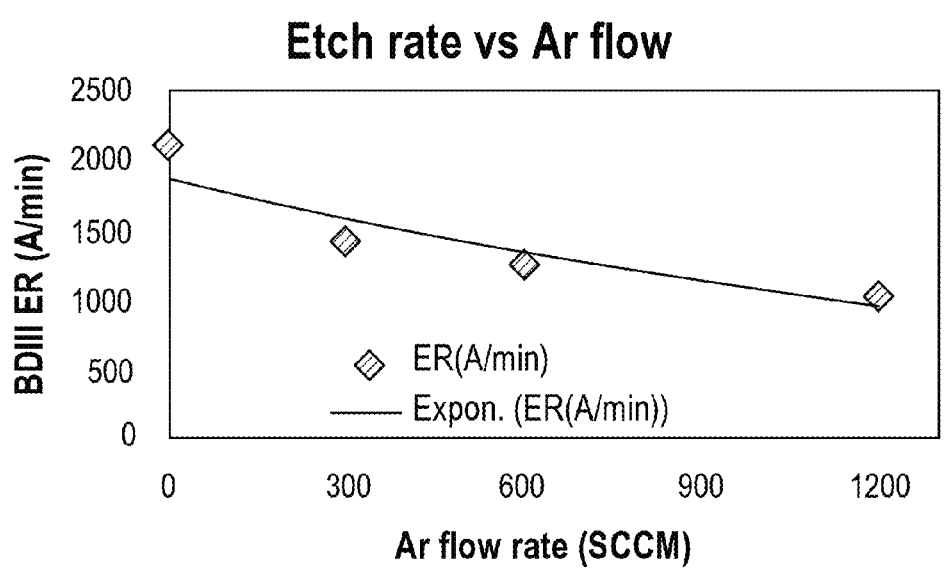
FIG. 5 is a plot of low k film etch rate as a function of Ar flow rate, in accordance with an embodiment of the present invention.

In one embodiment, increasing Ar dilutes the reactant flow of the $CF_4$ portion of the etchant. FIG. 5 is a plot 500 of low k film (BD III) etch rate (in Angstroms per minute) as a function of Ar flow rate (in SCCM), in accordance with an embodiment of the present invention. Referring to plot 500, an increasing amount of Ar included in an etch gas mixture for a SAV process flow can dilutes the reactant flow of the $CF_4$ portion of the etchant, providing a more controlled etching process. Specifically, via etch rate (ER) decreases almost 50% by increasing Ar flow rate from 0 to 1200 SCCM.

Figure 6:
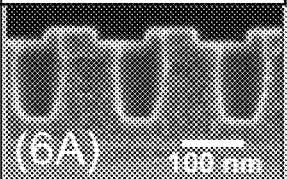
FIG. 6 includes a cross-sectional series 6A-6C of SEM images and corresponding top-down series 6AT-6CT of SEM images for a variety of processing operations in an SAV process flow, in accordance with an embodiment of the present invention.

In another aspect, considerations for SAV processing can also include titanium oxide (TiOx) residues resulting from etch a titanium nitride hardmask. For example, in one embodiment, such residues may form during the via etch operation described above in association with FIG. 2D. For example, FIG. 6 includes a cross-sectional series 6A-6C of SEM images and corresponding top-down series 6AT-6CT of SEM images for a variety of processing operations, in accordance with an embodiment of the present invention. Referring to SEM images 6A and 6AT, a reference sample has a larger via critical dimension (CD) due to non-SAV processing, e.g., representing via-to-line short at non-SAV processing. In an embodiment, TiOx residues are reduced by decreasing the wafer temperature (e.g., by reducing the electrostatic chuck (ESC) temperature). For example, referring to SEM images 6C and 6CT, the SAV process performed at 20 degrees Celsius shows less TiOx residue than the SAV process performed at 60 degrees Celsius (the latter depicted in SEM images 6B and 6BT. In one embodiment, the lower temperature processing minimizes Ti sputtering. Less Ti by-product sputtered at a lower ESC temperature results in less residue. In another embodiment, TiOx residues are reduced by raising RF power of a corresponding ash operation.

Figure 7:
FIG. 7 includes a cross-sectional series 7A-7C of SEM images and corresponding top-down series 7AT-7CT of SEM images for a variety of processing operations, in accordance with an embodiment of the present invention.

In another aspect, considerations for SAV processing can also include reducing TiOx residues by raising pressure of the SAV etch process. FIG. 7 includes a cross-sectional series 7A-7C of SEM images and corresponding top-down series 7AT-7CT of SEM images for a variety of processing operations, in accordance with an embodiment of the present invention. Referring to SEM images 7A and 7AT through 7C and 7CT, a residues-free SAV was achieved at higher pressure (e.g., 175 mTorr improved over 150 mTorr, which is improved over 125 mTorr). Thus, such residues are suppressed by higher pressure. In one embodiment, the mechanism to minimize TiOx residues is to minimize the TiOx sputtering on the side wall of via which is enabled by an increased pressure.

Figure 8:
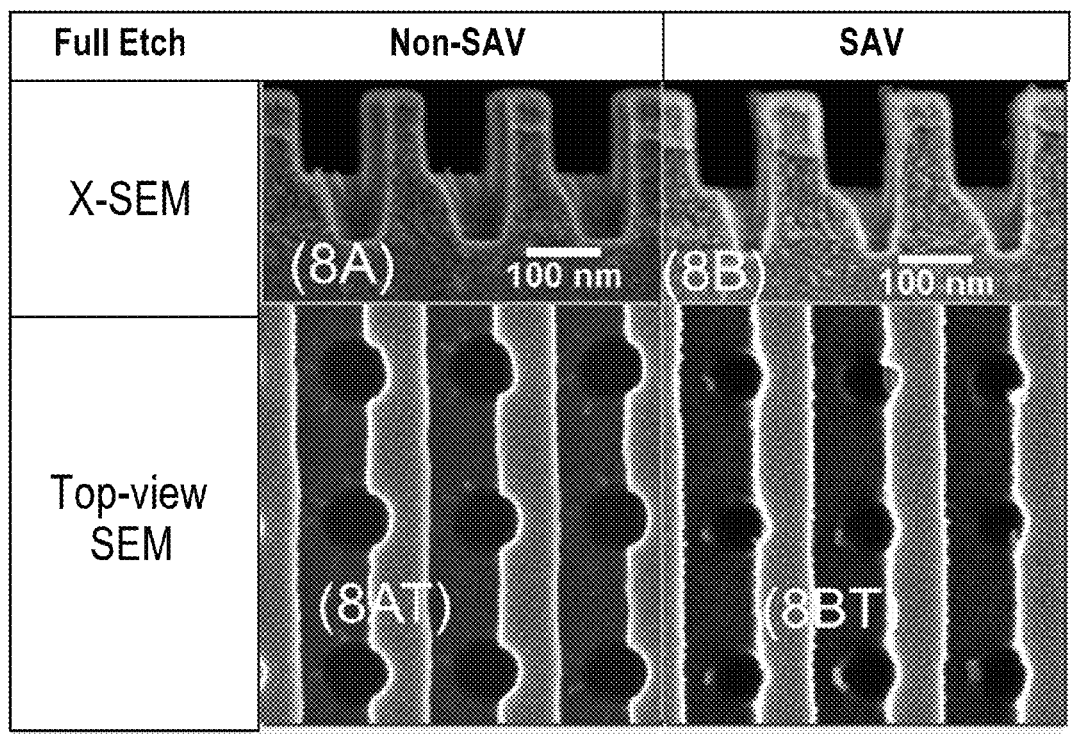
FIG. 8 includes a cross-sectional series 8A-8B of SEM images and corresponding top-down series 8AT-8BT of SEM images for a full etch comparison of a non-SAV and an SAV process flow, in accordance with an embodiment of the present invention.

FIG. 8 includes a cross-sectional series 8A-8B of SEM images and corresponding top-down series 8AT-8BT of SEM images for a full etch comparison of a non-SAV and an SAV process flow, in accordance with an embodiment of the present invention. Referring to FIG. 8, demonstrated TiN encroachment improvement is seen with the above described SAV process. In one such embodiment, a self-aligned-via etch process can be implemented successfully for a 45 nanometer critical dimension (CD45) dual damascene (DD) structure. In a specific embodiment, $H_2$ flow rate strongly impacts the TiN selectivity. In another specific embodiment, increasing Ar flow rate can be used to solve etch front issues. In yet another specific embodiment, minimizing Ti sputtering is shown to be an important factor to avoid TiOx residues.

Patterning of a low-k dielectric layer to form a self-aligned via may be conducted in processing equipment suitable to provide an etch plasma in proximity to a sample for etching. For example, FIG. 9 illustrates a system in which a method of low-k dielectric film patterning is performed, in accordance with an embodiment of the present invention.

Figure 9:
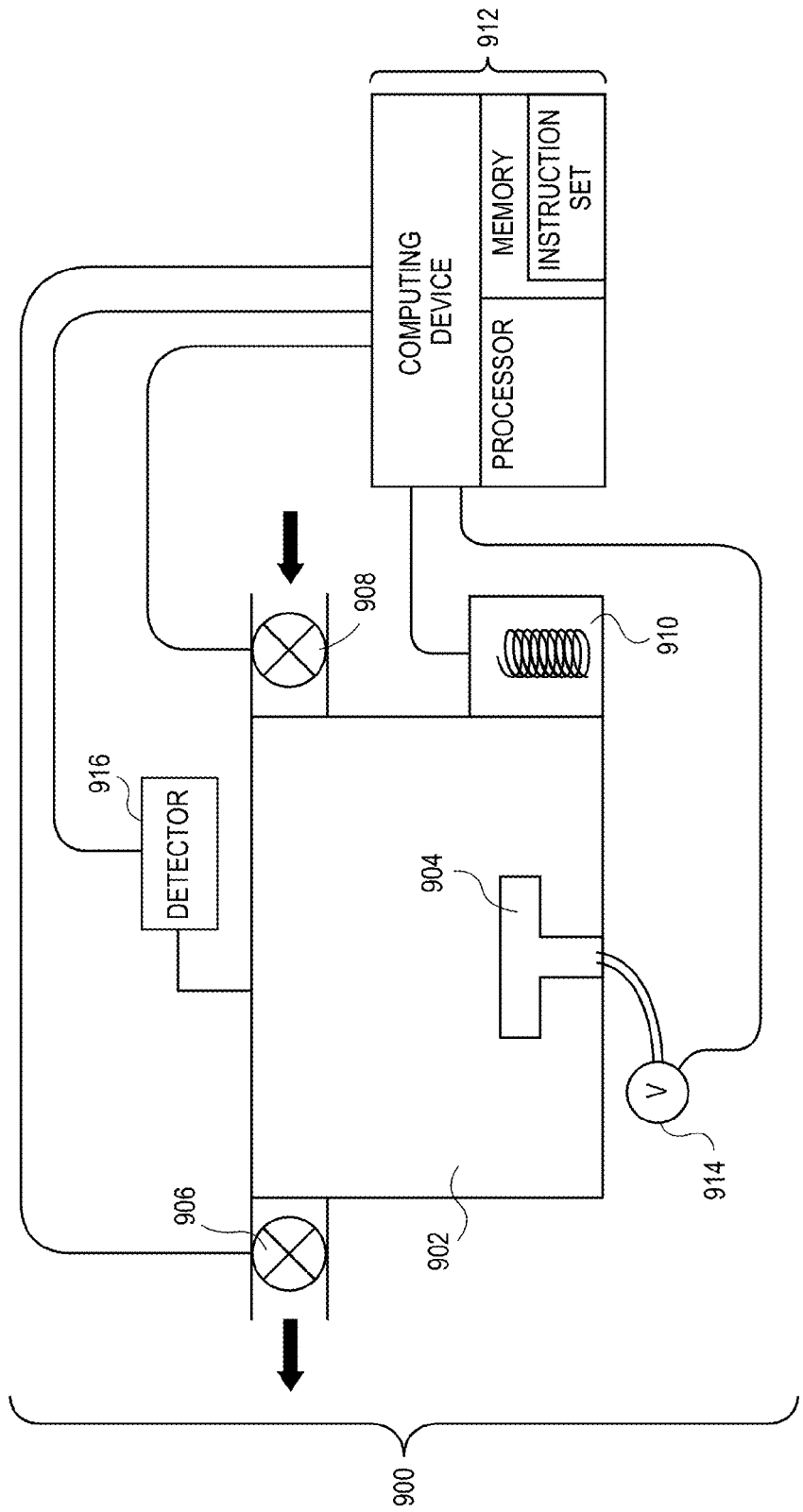
FIG. 9 illustrates a system in which a method of low-k dielectric film patterning is performed, in accordance with an embodiment of the present invention.

Referring to FIG. 9, a system 900 for conducting a plasma etch process includes a chamber 902 equipped with a sample holder 904. An evacuation device 906, a gas inlet device 908 and a plasma ignition device 910 are coupled with chamber 902. A computing device 912 is coupled with plasma ignition device 910. System 900 may additionally include a voltage source 914 coupled with sample holder 904 and a detector 916 coupled with chamber 902. Computing device 912 may also be coupled with evacuation device 906, gas inlet device 908, voltage source 914 and detector 916, as depicted in FIG. 9.

Chamber 902 and sample holder 904 may include a reaction chamber and sample positioning device suitable to contain an ionized gas, i.e. a plasma, and bring a sample in proximity to the ionized gas or charged species ejected there from. Evacuation device 906 may be a device suitable to evacuate and de-pressurize chamber 902. Gas inlet device 908 may be a device suitable to inject a reaction gas into chamber 902. Plasma ignition device 910 may be a device suitable for igniting a plasma derived from the reaction gas injected into chamber 902 by gas inlet device 908. Detection device 916 may be a device suitable to detect an end-point of a processing operation. In one embodiment, system 900 includes a chamber 902, a sample holder 904, an evacuation device 906, a gas inlet device 908, a plasma ignition device 910 and a detector 916 similar to, or the same as, those included in an Applied Centura® Enabler dielectric etch system, an Applied Materials™ AdvantEdge G3 system, or an Applied Materials™ C3 dielectric etch chamber.

In an embodiment, an SAV process is performed in chamber such as chamber 500. The recipe can involve one or more, or all, of the following operations 1-6. In one such embodiment, all operations 1-6 are performed in the sequence provided below and in a single pass in chamber.

Operation 1 is an OPL etch portion performed at a pressure of approximately 15 mTorr, a bottom bias (Wb) of approximately 200 W, a source power (Ws) of approximately 1500 W, and a chemistry based on $O_2$ (approximately 160 sccm), COS (approximately 45 sccm), $N_2$ (approximately 25 sccm), a showerhead to wafer gap of approximately 1.3 mm, an ESC temperature of approximately 20 C, for approximately 95 seconds.

Operation 2 is a via main etch portion (e.g., SAV portion) performed at a pressure of approximately 175 mTorr, a bottom bias (Wb) of approximately 250 W, a source power (Ws) of approximately 700 W, a chemistry based on $CF_4$ (approximately 15 sccm), $H_2$ (approximately 500 sccm), $N_2$ (approximately 50 sccm), Ar (approximately 1200 sccm), a showerhead to wafer gap of approximately 2.7 mm, an ESC temperature of approximately 20° C., for approximately 95 seconds.

Operation 3 is an ash portion performed at a pressure of approximately 15 mTorr, a bottom bias (Wb) of approximately 400 W, a source power (Ws) of approximately 600 W, a chemistry based on $CO_2$ (approximately 500 sccm), a showerhead to wafer gap of approximately 3.5 mm, an ESC temperature of approximately 65° C., for approximately 120 seconds.

Operation 4 is a trench main etch portion performed at a pressure of approximately 40 mTorr, a bottom bias (Wb) of approximately 250 W, a source power (Ws) of approximately 300 W, a chemistry based on $CF_4$ (approximately 10 sccm), $C_4F_8$ (approximately 400 sccm), $N_2$ (approximately 15 sccm), Ar (approximately 1200 sccm), a showerhead to wafer gap of approximately 2.5 mm, an ESC temperature of approximately 65° C., for approximately 123 seconds.

Operation 5 is a post etch treatment portion performed at a pressure of approximately 15 mTorr, a bottom bias (Wb) of approximately 200 W, a source power (Ws) of approximately 0 W, a chemistry based on $O_2$ (approximately 3 sccm), $N_2$ (approximately 200 sccm), a showerhead to wafer gap of approximately 3.5 mm, an ESC temperature of approximately 65° C., for approximately 10 seconds.

Operation 6 is a second post etch treatment portion performed at a pressure of approximately 15 mTorr, a bottom bias (Wb) of approximately 200 W, a source power (Ws) of approximately 0 W, a chemistry based on chemistry $N_2$ (approximately 200 sccm), a showerhead to wafer gap of approximately 3.5 mm, an ESC temperature of approximately 65° C., for approximately 9 seconds.

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 10:
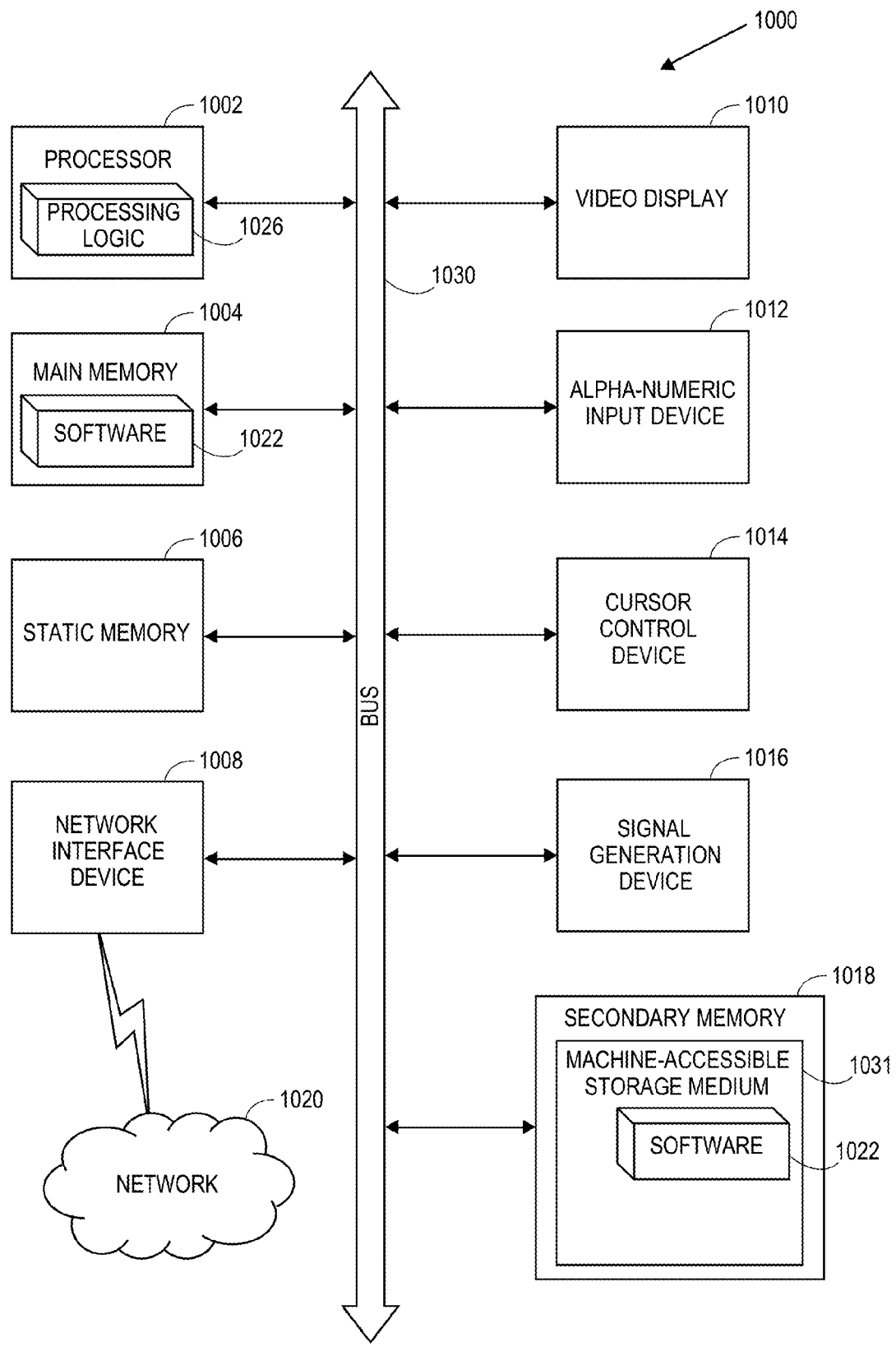
FIG. 10 illustrates a block diagram of an exemplary computer system, in accordance with an embodiment of the present invention.

FIG. 10 illustrates a diagrammatic representation of a machine in the exemplary form of a computer system 1000 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1002 may also be one or more special-purpose processing devices such as an application specific integrated circuit (ASIC), a field programmable gate array (FPGA), a digital signal processor (DSP), network processor, or the like. Processor 1002 is configured to execute the processing logic 1026 for performing the operations discussed herein.

The computer system 1000 may further include a network interface device 1008. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1031 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

While the machine-accessible storage medium 1031 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a non-transitory machine-accessible storage medium has instructions stored thereon which cause a data processing system to perform a method of forming a self-aligned via (SAV) in a low-k dielectric film. The method includes etching a via pattern at least partially into in a low-k dielectric film having a metal nitride hard mask layer with a trench pattern thereon, the etching comprising using a plasma etch performed at a pressure of approximately 175 mTorr, a bottom bias (Wb) of approximately 250 W, a source power (Ws) of approximately 700 W, a chemistry based on $CF_4$ (approximately 15 sccm), $H_2$ (approximately 500 sccm), $N_2$ (approximately 50 sccm), Ar (approximately 1200 sccm), a showerhead to wafer gap of approximately 2.7 mm, an ESC temperature of approximately 20° C., for approximately 95 seconds.

In one embodiment, the method further includes, prior to etching the via pattern in the low-k dielectric film, etching the via pattern in an optical planarization layer disposed above the low-k dielectric film, the etching comprising using a plasma etch performed at a pressure of approximately 15 mTorr, a bottom bias (Wb) of approximately 200 W, a source power (Ws) of approximately 1500 W, and a chemistry based on $O_2$ (approximately 160 sccm), COS (approximately 45 sccm), $N_2$ (approximately 25 sccm), a showerhead to wafer gap of approximately 1.3 mm, an ESC temperature of approximately 20° C., for approximately 95 seconds.

In one embodiment, the method further includes, subsequent to etching the via pattern in the low-k dielectric film, ashing to remove the optical planarization layer, the ashing comprising using a plasma etch performed at a pressure of approximately 15 mTorr, a bottom bias (Wb) of approximately 400 W, a source power (Ws) of approximately 600 W, a chemistry based on $CO_2$ (approximately 500 sccm), a showerhead to wafer gap of approximately 3.5 mm, an ESC temperature of approximately 65° C., for approximately 120 seconds.

In one embodiment, the method further includes, subsequent to etching the via pattern in the low-k dielectric film, etching the trench pattern at least partially into in the low-k dielectric film, the etching comprising using a plasma etch performed at a pressure of approximately 40 mTorr, a bottom bias (Wb) of approximately 250 W, a source power (Ws) of approximately 300 W, a chemistry based on $CF_4$ (approximately 10 sccm), $C_4F_8$ (approximately 400 sccm), $N_2$ (approximately 15 sccm), Ar (approximately 1200 sccm), a showerhead to wafer gap of approximately 2.5 mm, an ESC temperature of approximately 65° C., for approximately 123 seconds.

In one embodiment, the method further includes, subsequent to etching the via pattern in the low-k dielectric film, treating the low-k dielectric film by exposing the low-k dielectric film to a plasma at a pressure of approximately 15 mTorr, a bottom bias (Wb) of approximately 200 W, a source power (Ws) of approximately 0 W, a chemistry based on $O_2$ (approximately 3 sccm), $N_2$ (approximately 200 sccm), a showerhead to wafer gap of approximately 3.5 mm, an ESC temperature of approximately 65° C., for approximately 10 seconds.

In one embodiment, the method further includes, subsequent to treating the low-k dielectric film by exposing the low-k dielectric film to the plasma, further treating the low-k dielectric film by exposing the low-k dielectric film to a plasma at a pressure of approximately 15 mTorr, a bottom bias (Wb) of approximately 200 W, a source power (Ws) of approximately 0 W, a chemistry based on chemistry $N_2$ (approximately 200 sccm), a showerhead to wafer gap of approximately 3.5 mm, an ESC temperature of approximately 65° C. for approximately 9 seconds.

In one embodiment, the method further includes, prior to etching the via pattern in the low-k dielectric film, etching the via pattern in an optical planarization layer disposed above the low-k dielectric film, the etching comprising using a plasma etch performed at a pressure of approximately 15 mTorr, a bottom bias (Wb) of approximately 200 W, a source power (Ws) of approximately 1500 W, and a chemistry based on $O_2$ (approximately 160 sccm), COS (approximately 45 sccm), $N_2$ (approximately 25 sccm), a showerhead to wafer gap of approximately 1.3 mm, an ESC temperature of approximately 20° C., for approximately 95 seconds, and subsequent to etching the via pattern in the low-k dielectric film, ashing to remove the optical planarization layer, the ashing comprising using a plasma etch performed at a pressure of approximately 15 mTorr, a bottom bias (Wb) of approximately 400 W, a source power (Ws) of approximately 600 W, a chemistry based on $CO_2$ (approximately 500 sccm), a showerhead to wafer gap of approximately 3.5 mm, an ESC temperature of approximately 65° C., for approximately 120 seconds and, subsequently, etching the trench pattern at least partially into in the low-k dielectric film, the etching comprising using a plasma etch performed at a pressure of approximately 40 mTorr, a bottom bias (Wb) of approximately 250 W, a source power (Ws) of approximately 300 W, a chemistry based on $CF_4$ (approximately 10 sccm), $C_4F_8$ (approximately 400 sccm), $N_2$ (approximately 15 sccm), Ar (approximately 1200 sccm), a showerhead to wafer gap of approximately 2.5 mm, an ESC temperature of approximately 65° C., for approximately 123 seconds and, subsequently, treating the low-k dielectric film by exposing the low-k dielectric film to a plasma at a pressure of approximately 15 mTorr, a bottom bias (Wb) of approximately 200 W, a source power (Ws) of approximately 0 W, a chemistry based on $O_2$ (approximately 3 sccm), $N_2$ (approximately 200 sccm), a showerhead to wafer gap of approximately 3.5 mm, an ESC temperature of approximately 65° C., for approximately 10 seconds and, subsequently, further treating the low-k dielectric film by exposing the low-k dielectric film to a plasma at a pressure of approximately 15 mTorr, a bottom bias (Wb) of approximately 200 W, a source power (Ws) of approximately 0 W, a chemistry based on chemistry $N_2$ (approximately 200 sccm), a showerhead to wafer gap of approximately 3.5 mm, an ESC temperature of approximately 65° C., for approximately 9 seconds.

In one embodiment, etching the via pattern in the optical planarization layer, etching the via pattern at least partially into in the low-k dielectric film, ashing to remove the optical planarization layer, etching the trench pattern at least partially into in the low-k dielectric film, treating the low-k dielectric film, and further treating the low-k dielectric film is performed in a single pass in an etch chamber.

Thus, methods of fabricating ultra low-k dielectric self-aligned vias have been disclosed.

What is claimed is:

1. A method of forming a self-aligned via (SAV) in a low-k dielectric film, the method comprising:
etching a via pattern at least partially into in a low-k dielectric film having a metal nitride hard mask layer with a trench pattern thereon, the etching comprising using a plasma etch performed at a pressure of approximately 175 mTorr, a bottom bias (Wb) of approximately 250 W, a source power (Ws) of approximately 700 W, a chemistry based on $CF_4$ at a flow rate of approximately 15 sccm, $H_2$ at a flow rate of approximately 500 sccm, $N_2$ at a flow rate of approximately 50 sccm, and Ar at a flow rate of approximately 1200 sccm, a showerhead to wafer gap of approximately 2.7 mm, an electrostatic chuck temperature of approximately 20° C., for approximately 95 seconds.

2. The method of claim 1, further comprising:
subsequent to etching the via pattern in the low-k dielectric film, etching the trench pattern at least partially into in the low-k dielectric film, the etching comprising using a plasma etch performed at a pressure of approximately 40 mTorr, a bottom bias (Wb) of approximately 250 W, a source power (Ws) of approximately 300 W, a chemistry based on $CF_4$ at a flow rate of approximately 10 sccm, $C_4F_8$ at a flow rate of approximately 400 sccm, $N_2$ at a flow rate of approximately 15 sccm, Ar at a flow rate of approximately 1200 sccm, a showerhead to wafer gap of approximately 2.5 mm, an electrostatic chuck temperature of approximately 65° C., for approximately 123 seconds.

3. The method of claim 1, further comprising:
prior to etching the via pattern in the low-k dielectric film, etching the via pattern in an optical planarization layer disposed above the low-k dielectric film, the etching comprising using a plasma etch performed at a pressure of approximately 15 mTorr, a bottom bias (Wb) of approximately 200 W, a source power (Ws) of approximately 1500 W, and a chemistry based on $O_2$ at a flow rate of approximately 160 sccm, COS at a flow rate of approximately 45 sccm, $N_2$ at a flow rate of approximately 25 sccm, a showerhead to wafer gap of approximately 1.3 mm, an electrostatic chuck temperature of approximately 20° C., for approximately 95 seconds.

4. The method of claim 2, further comprising:
subsequent to etching the via pattern in the low-k dielectric film, ashing to remove the optical planarization layer, the ashing comprising using a plasma etch performed at a pressure of approximately 15 mTorr, a bottom bias (Wb) of approximately 400 W, a source power (Ws) of approximately 600 W, a chemistry based on $CO_2$ at a flow rate of approximately 500 sccm, a showerhead to wafer gap of approximately 3.5 mm, an electrostatic chuck temperature of approximately 65° C., for approximately 120 seconds.

5. The method of claim 1, further comprising:
subsequent to etching the via pattern in the low-k dielectric film, treating the low-k dielectric film by exposing the low-k dielectric film to a plasma at a pressure of approximately 15 mTorr, a bottom bias (Wb) of approximately 200 W, a source power (Ws) of approximately 0 W, a chemistry based on $O_2$ at a flow rate of approximately 3 sccm, $N_2$ at a flow rate of approximately 200 sccm, a showerhead to wafer gap of approximately 3.5 mm, electrostatic chuck temperature of approximately 65° C., for approximately 10 seconds.

6. The method of claim 5, further comprising:
subsequent to treating the low-k dielectric film by exposing the low-k dielectric film to the plasma, further treating the low-k dielectric film by exposing the low-k dielectric film to a plasma at a pressure of approximately 15 mTorr, a bottom bias (Wb) of approximately 200 W, a source power (Ws) of approximately 0 W, a chemistry based on chemistry $N_2$ at a flow rate of approximately 200 sccm, a showerhead to wafer gap of approximately 3.5 mm, an electrostatic chuck temperature of approximately 65° C., for approximately 9 seconds.

7. The method of claim 1, further comprising:

prior to etching the via pattern in the low-k dielectric film, etching the via pattern in an optical planarization layer disposed above the low-k dielectric film, the etching comprising using a plasma etch performed at a pressure of approximately 15 mTorr, a bottom bias (Wb) of approximately 200 W, a source power (Ws) of approximately 1500 W, and a chemistry based on $O_2$ at a flow rate of approximately 160 sccm, COS at a flow rate of approximately 45 sccm, $N_2$ at a flow rate of approximately 25 sccm, a showerhead to wafer gap of approximately 1.3 mm, an electrostatic chuck temperature of approximately 20° C., for approximately 95 seconds; and subsequent to etching the via pattern in the low-k dielectric film, ashing to remove the optical planarization layer, the ashing comprising using a plasma etch performed at a pressure of approximately 15 mTorr, a bottom bias (Wb) of approximately 400 W, a source power (Ws) of approximately 600 W, a chemistry based on $CO_2$ at a flow rate of approximately 500 sccm, a showerhead to wafer gap of approximately 3.5 mm, an electrostatic chuck temperature of approximately 65° C., for approximately 120 seconds; and, subsequently, etching the trench pattern at least partially into in the low-k dielectric film, the etching comprising using a plasma etch performed at a pressure of approximately 40 mTorr, a bottom bias (Wb) of approximately 250 W, a source power (Ws) of approximately 300 W, a chemistry based on $CF_4$ at a flow rate of approximately 10 sccm, $C_4F_8$ at a flow rate of approximately 400 sccm, $N_2$ at a flow rate of approximately 15 sccm, Ar at a flow rate of approximately 1200 sccm, a showerhead to wafer gap of approximately 2.5 mm, an electrostatic chuck temperature of approximately 65° C., for approximately 123 seconds; and, subsequently, treating the low-k dielectric film by exposing the low-k dielectric film to a plasma at a pressure of approximately 15 mTorr, a bottom bias (Wb) of approximately 200 W, a source power (Ws) of approximately 0 W, a chemistry based on $O_2$ at a flow rate of approximately 3 sccm, $N_2$ at a flow rate of approximately 200 sccm, a showerhead to wafer gap of approximately 3.5 mm, an electrostatic chuck temperature of approximately 65° C., for approximately 10 seconds; and, subsequently, further treating the low-k dielectric film by exposing the low-k dielectric film to a plasma at a pressure of approximately 15 mTorr, a bottom bias (Wb) of approximately 200 W, a source power (Ws) of approximately 0 W, a chemistry based on chemistry $N_2$ at a flow rate of approximately 200 sccm, a showerhead to wafer gap of approximately 3.5 mm, an electrostatic chuck temperature of approximately 65° C., for approximately 9 seconds.

8. The method of claim 7, wherein etching the via pattern in the optical planarization layer, etching the via pattern at least partially into in the low-k dielectric film, ashing to remove the optical planarization layer, etching the trench pattern at least partially into in the low-k dielectric film, treating the low-k dielectric film, and further treating the low-k dielectric film is performed in a single pass in an etch chamber.

* * * * *